United States Patent
Wang et al.

(10) Patent No.: US 10,033,009 B2
(45) Date of Patent: Jul. 24, 2018

(54) BEARING FRAME FOR DISPLAY PANEL AND DISPLAY DEVICE

(71) Applicant: BOE Technology Group Co., Ltd., Beijing (CN)

(72) Inventors: Zifeng Wang, Beijing (CN); Yan Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 14/785,681

(22) PCT Filed: Mar. 25, 2015

(86) PCT No.: PCT/CN2015/075037
§ 371 (c)(1),
(2) Date: Oct. 20, 2015

(87) PCT Pub. No.: WO2016/074411
PCT Pub. Date: May 19, 2016

(65) Prior Publication Data
US 2016/0343973 A1    Nov. 24, 2016

(30) Foreign Application Priority Data
Nov. 13, 2014    (CN) ..................... 2014 2 0678571 U

(51) Int. Cl.
*H01L 23/02* (2006.01)
*H01L 51/52* (2006.01)

(52) U.S. Cl.
CPC ................ *H01L 51/5237* (2013.01)

(58) Field of Classification Search
CPC ................................................. H01L 51/5237
(Continued)

(56) References Cited

U.S. PATENT DOCUMENTS

| | | | | |
|---|---|---|---|---|
| 2014/0362328 A1* | 12/2014 | Kuroki | ............. | G02F 1/133308 349/58 |
| 2015/0234226 A1* | 8/2015 | Ikuta | ................ | G02F 1/133308 349/58 |
| 2015/0362787 A1* | 12/2015 | Yuan | ................ | G02F 1/133308 349/58 |

FOREIGN PATENT DOCUMENTS

| CN | 201340697 Y | 11/2009 |
|---|---|---|
| CN | 202008560 U | 10/2011 |

(Continued)

OTHER PUBLICATIONS

International Search Report and Written Opinion for PCT Application No. PCT/CN2015/075037, dated Aug. 2015, 9 pages.
(Continued)

*Primary Examiner* — Ajay K Arora
(74) *Attorney, Agent, or Firm* — Westman, Champlin & Koehler, P.A.

(57) ABSTRACT

Embodiments of the present invention relate to a technical field of display device and provide a bearing frame for a display panel and a display device, which can reduce the occurrence of the damage of the display panel by the vibration when transporting and assembling the display panel and thus increase the useful life of the display device. The bearing frame for a display panel comprises a bottom plate and a plurality of side plates, the bottom plate and the plurality of side plates enclosing a bearing space for accommodating the display panel, wherein an accommodating slot is disposed in the bottom plate and a cushion is disposed in the accommodating slot, and the thickness of the cushion is no less than the depth of the accommodating slot.

14 Claims, 2 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 203760005 U | 8/2014 |
| CN | 204167326 U | 2/2015 |
| JP | 07-168177 A | 7/1995 |

OTHER PUBLICATIONS

English translation of Box No. V from the Written Opinion for the International Searching Authority for PCT Application No. PCT/CN2015/075037, 1 page.

* cited by examiner

BEARING FRAME FOR DISPLAY PANEL AND DISPLAY DEVICE

CROSS-REFERENCE TO RELATED APPLICATION

This application is a Section 371 National Stage Application of International Application No. PCT/CN2015/075037, filed on Mar. 25, 2015, entitled "Bearing Frame for Display Panel and Display Device", which has not yet published, which claims priority to Chinese Application No. 201420678571.6, filed on Nov. 13, 2014, incorporated herein by reference in their entirety.

BACKGROUND OF THE INVENTION

Field of the Invention

Embodiments of the present invention relate to a display field, in particular, to a bearing frame for a display panel and a display device.

Description of the Related Art

With the vigorous development of the plane display device, compared to the traditional liquid crystal display panel, the organic light emitting diode (OLED) display panel is gradually dominating a new generation of flat-panel display device due to its characteristics such as fast response, wide color gamut, super-thin thickness, self-emission and flexibility.

FIG. 1 is a schematic structural view of an OLED display device in prior art. As shown in FIG. 1, the OLED display device comprises: a bearing frame 02 and an OLED display panel 01, the bearing frame 02 comprising a bottom plate 021 and a plurality of side plates 022, the bottom plate 021 and the plurality of side plates 022 enclosing a bearing space for accommodating the OLED display panel 01 having an active display area and a peripheral area.

It can be seen that the OLED display panel 01 contacts the bearing frame 02 directly in prior art. The bearing frame 02 is formed generally by hard material, when assembling the OLED display panel 01 and the bearing frame 02, a strong vibration may be generated when the OLED display panel 01 falls into the bearing frame 02, thereby the OLED display device may be damaged, if the OLED display panel is placed into the bearing frame 02 in a wrong position or with an incorrect force.

SUMMARY OF THE INVENTION

Embodiments of the present invention provide a bearing frame for a display panel and a display device, which can reduce the occurrence of the damage of the display panel by the vibration when transporting and assembling the display panel and thus increase the useful life of the display device.

In order to achieve the above purposes, embodiments of the present invention provide the following technical solutions.

An embodiment of the present invention provides a bearing frame for a display panel, comprising a bottom plate and a plurality of side plates, the bottom plate and the plurality of side plates enclosing a bearing space for accommodating the display panel, wherein an accommodating slot is disposed in the bottom plate and a cushion is disposed in the accommodating slot, and the thickness of the cushion is no less than the depth of the accommodating slot.

In an implementation, the position of the accommodating slot corresponds to the active display area of the display panel.

In an implementation, the cushion has an inverted trapezoid structure and the cushion is in an interference fit with the accommodating slot.

In an implementation, a dust-proof pad is disposed at a position of the bottom plate adjacent to at least one side thereof for bearing a peripheral area of the display panel.

In an implementation, the dust-proof pad is disposed at all positions of the bottom plate for bearing the peripheral area of the display panel.

In an implementation, a dust-proof slot is disposed in a position of the bottom plate corresponding to the dust-proof pad, and the dust-proof slot is more adjacent to the side plate than the dust-proof pad.

In an implementation, the dust-proof pad extends to a position above an adjacent dust-proof slot and covers a part of an opening of the dust-proof slot.

In an implementation, a surface of the dust-proof pad facing towards to a side plate adjacent thereto is an inclined surface which inclines towards the cushion.

In an implementation, a black diffuse layer is disposed on a surface of the dust-proof pad facing away from the bottom plate.

In an implementation, the outside surfaces of the dust-proof pad and the cushion are coarse surfaces.

In an implementation, the dust-proof pad and the cushion are formed as an integrated structure.

In an implementation, the dust-proof pad is formed from silicone material and/or the cushion is formed from silicone material.

Another embodiment of the present invention further provides a display device comprising a display panel and the bearing frame for a display panel according to any of the above embodiments or implementations.

In the embodiments, the display panel may be OLED display panel. Of course, the display panel may also be other display panel with self-luminous characteristic such as PDP, FED or the like, which are omitted herein.

LIST OF REFERENCE NUMERAL

01—OLED display panel; 02—bearing frame; 021—bottom plate; 022—side plate; 1—bearing frame; 11—bottom plate; 111—accommodating slot; 112—dust-proof slot; 12—side plate; 3—cushion; 4—dust-proof pad.

DETAILED DESCRIPTION OF PREFERRED EMBODIMENTS OF THE INVENTION

Hereafter, the technical solutions in the embodiments of the present invention will be clearly and completely described with reference to the accompanying drawings in the embodiments of the present invention. Apparently, the described embodiments are merely a part rather than all of the embodiments of the present invention. All other embodiments obtained by those skilled in the art based on the embodiments of the present invention without creative efforts shall fall within the protection scope of the present invention.

In prior art, the OLED display panel contacts the bearing frame directly, and the bearing frame is formed generally by hard material, when assembling the OLED display panel and the bearing frame, a strong vibration may be generated when the OLED display panel falls into the bearing frame, thereby the OLED display device may be damaged, if the OLED display panel is placed into the bearing frame in a wrong position or with an incorrect force. In view of this defect in prior art, embodiments of the present invention provide a bearing frame for a display panel for reducing the occurrence of the damage of the display panel by the vibration.

Figure 1:
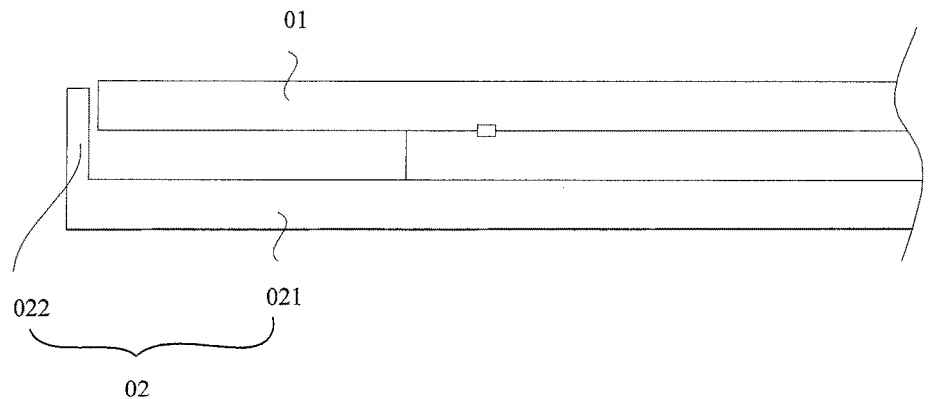
FIG. 1 is a schematic structural view of an OLED display device in prior art.
Figure 2:
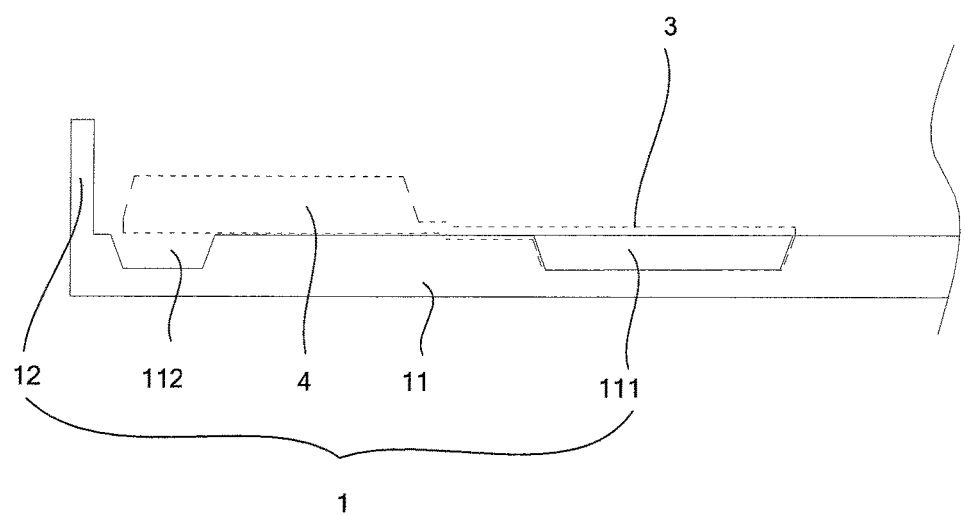
FIG. 2 is a schematic structural view of a bearing frame of a display device according to an embodiment of the present invention.
Figure 3:
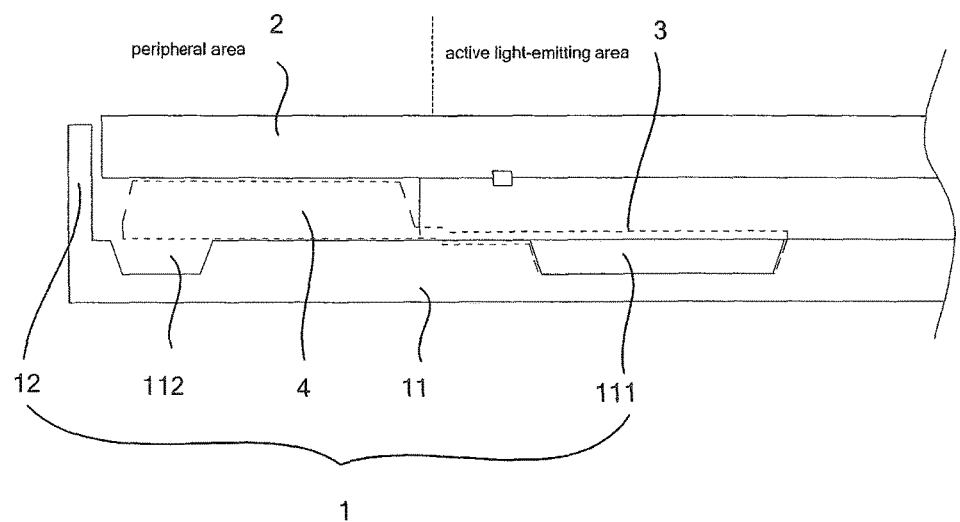
FIG. 3 is a schematic structural view of the display device according to an embodiment of the present invention, assembled with the bearing frame.

The First Embodiment:

FIG. 2 is a schematic structural view of a bearing frame of a display device according to an embodiment of the present invention, and FIG. 3 is a schematic structural view of the display device according to an embodiment of the present invention, assembled with the bearing frame. It should be noted that the display panel which may be carried by the bearing frame according to the embodiments of the present invention may include various display panels such as LED, electronic ink, OLED display panel or the like, and preferably, the embodiments of the present invention take the OLED display panel as an example. As shown in FIGS. 2 and 3, the embodiment of the present invention provide a bearing frame 1 of display panel comprising: a bottom plate 11 and a plurality of side plates 12, the bottom plate 11 and the plurality of side plates 12 enclosing a bearing space for accommodating the OLED display panel 2. An accommodating slot 111 is disposed in the bottom plate 11, and a cushion 3 is disposed in the accommodating slot 111, and the thickness of the cushion 3 is no less than the depth of the accommodating slot 111.

The bearing frame 1 of display panel according to the embodiment of the present invention provides a buffering power when the display panel 2 is placing into the bearing frame 1 by disposing a cushion 3 on the bottom plate 11 of the bearing frame 1, reducing the occurrence of the damage of the display panel 2 by the vibration. Meanwhile, it is ensured that the thickness of the display device will not be greatly affected after placing the cushion 3 with a certain thickness by disposing the accommodating slot 111 in the bottom plate 11 of the bearing frame 1, so as to meet the requirement of the thickness of the display device.

Thus, the bearing frame for a display panel according to the embodiment of the present invention may reduce the occurrence of the damage of the display panel by the vibration when transporting and assembling the display panel.

Further, the position of the accommodating slot 11 corresponds to the active display area of the display panel 2, thereby relieving the force applied to the peripheral area of the display panel 2 when assembling the display panel 2.

The cushion 3 may be in various shapes such as cuboid, cube, polyhedron or the like. Preferably, the cushion 3 according to the embodiment of the present invention has an inverted trapezoid structure and is in an interference fit with the accommodating slot 111. The cushion 3 of the inverted trapezoid structure is easy to fit with the accommodating slot 111 due to inclined angles at its two sides, and the cushion 3 is in an interference fit with the accommodating slot 111 to avoid the movement of the cushion 3 in the accommodating slot 111.

Further, as shown in FIG. 3, the dust-proof pad 4 is disposed at a position of the bottom plate 11 adjacent to at least one side thereof for bearing the peripheral area of the display panel 2. In the existing display device, in order to facilitate placing the display panel, there is a gap between at least one side of the display panel and the side plate of the bearing frame after placing the display panel in the bearing frame, and there is a gap between the peripheral area of the display panel and the bottom plate of the bearing frame; if the display panel is not packaged hermetically, the impurity such as the dust in the environment or the like will be easy to enter into the display panel through the gap between the side plates of the display panel and the bearing frame and through the gap between the peripheral area of the display panel and the bottom plate of the bearing frame, affecting the useful life of the display device. In the embodiments of the present invention, the dust-proof pad is disposed at a position of the bottom plate adjacent to at least one side thereof for bearing the peripheral area of the display panel, which may be used to isolate the impurity such as the dust in the environment or the like, so as to avoid the impurity such as the dust in the environment or the like entering into the display panel and thus increase the useful life of the display device.

In a preferable embodiment, the dust-proof pad 4 is disposed at all the positions of the bottom plate 1 for bearing the peripheral area of the display panel 2 in order to increase the useful life of the display device further. For example, the existing display panel generally has a cuboid shape, and in order to prevent the dust from entering into the display panel from any of the sides thereof, the dust-proof pad 4 is disposed at all the positions of the bottom plate 1 for bearing the peripheral area of the display panel 2, that is, the dust-proof pad 4 is disposed as a ring.

Further, as shown in FIG. 3, a dust-proof slot 112 is disposed in the bottom plate 1 corresponding to the dust-proof pad 4 and is more adjacent to the side plate 12 than the dust-proof pad 4. The dust-proof 112 is used to receive the impurity such as the dust or the like.

In a particular embodiment, as shown in FIG. 3, the dust-proof pad 4 extend to a position above an adjacent dust-proof slot 112 so as to cover a part of an opening of the dust-proof slot 112, which may prevent the dust entering into the display device further.

The dust-proof pad may be in various shapes such as cuboid, cube, sphenoid, polyhedron or the like. Optionally, as shown in FIG. 3, a side of the dust-proof pad 4 facing towards the side plate 12 adjacent thereto is an inclined plane which inclines towards the cushion 3. The dust-proof pad has a trapezoid structure with the inclined plane which facilitates guiding the dust into the dust-proof slot along the inclined plane. Thus, the inclined plane of the dust-proof pad is used to guide the dust and may ensure a directional flow of the dust to prevent the dust entering the middle area of the bottom plate 11, that is, the portion corresponding to the active emitting area of the display panel, thereby reducing the influence of dust on the display while guiding the dust in the dust-proof slot to the outside along the inclined plane of the dust-proof pad.

In the prior art, the active display area of the display panel is light-proof and the peripheral area thereof has a certain light transmission. As an example, the active display area of the OLED display device is generally black when it is not in a display state, and when the exterior light illuminates on the OLED display device, the light will not be transmitted through the active display area of the OLED display device and thus will be reflected at the metal layer of the OLED display device, while the light illuminating on the peripheral area of the OLED display penal will be transmitted through the OLED display panel and thus will be reflected on the bottom plate of the bearing frame, so that a chromatic aberration between the active display area of the OLED display panel and the peripheral area thereof will be displayed on the product appearance. Of course, the above problem may also occur when the OLED display device is in a display state, but the problem is more obvious when the OLED display device is not in a display state. In the bearing frame for a display panel according to the embodiment of the present invention, a black diffuse layer is disposed on the side of the dust-proof pad away from the bottom plate. The black diffuse layer may absorb a part of the light and may reduce the chromatic aberration between the active display area of the OLED display panel and the peripheral area thereof by its diffuse function.

In a specific implementation, the outside surfaces of the dust-proof pad 4 and the cushion 3 are coarse surface which can prevent the dust-proof pad 4 and the cushion 3 from moving.

Figure 4:
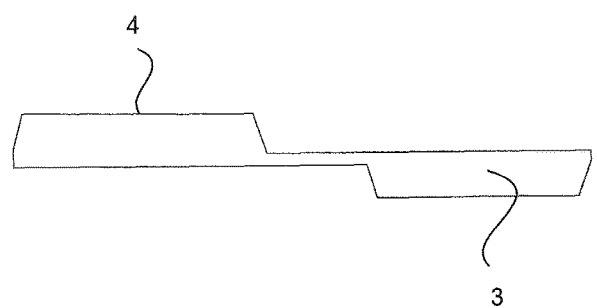
FIG. 4 is a schematic structural view of a dust-proof pad and a cushion disposed on the bearing frame of the display device according to an embodiment of the present invention.

Optionally, FIG. 4 is a schematic structural view of a dust-proof pad and a cushion disposed on the bearing frame of the display device according to an embodiment of the present invention. As shown in FIG. 4, the dust-proof pad 4 and the cushion 3 may be an integrated structure which may be convenient to operate and save cost.

Optionally, as shown in FIG. 4, the dust-proof pad 4 may have the totally same structure as the cushion 3, except that the orientations thereof are different, thereby simplifying the manufacturing process and saving cost further.

The dust-proof pad and the cushion may be formed from various material, as long as a certain amount of elastic deformation is generated with a certain force. Optionally, the dust-proof pad is formed from silicone material, and/or the cushion is formed from silicone material. In other words, the dust-proof pad is formed from silicone material; or the cushion is formed from silicone material; or both the dust-proof and the cushion are formed from silicone material.

The Second Embodiment:

An embodiment of the present invention provides a display device comprising a display panel and the bearing frame of the display panel according to any of the above embodiments. The bearing frame of the display panel can reduce the occurrence of the damage of the display panel by the vibration when transporting and assembling the display panel, the display device according to the embodiment of the present invention thus has a longer useful life.

In specific embodiments, the display panel may be OLED display panel. Of course, the display panel may also be other display panel with self-luminous characteristic such as PDP, FED or the like, which are omitted herein.

Obviously, various modifications and changes may be made to the embodiments of the present invention by those skilled in the art without departing from the spirit and scope of the present invention. Thus, these modifications and changes are intended to be included in the present invention if they fall into the claims of the present invention and the equivalent technology thereof.

What is claimed is:

1. A bearing frame fora display panel, comprising a bottom plate and a plurality of side plates, the bottom plate and the plurality of side plates enclosing a bearing space for accommodating the display panel, wherein the bottom plate is located at a side of the display panel opposite to a display surface of the display panel, an accommodating slot is disposed in the bottom plate and recessed downwards away from a surface of the bottom plate facing the display panel so as to have a depth less than the thickness of the bottom plate, and a cushion is disposed in the accommodating slot, and the thickness of the cushion is no less than the depth of the accommodating slot.

2. The bearing frame according to claim 1, wherein the position of the accommodating slot corresponds to the position of an active display area of the display panel.

3. The bearing frame according to claim 1, wherein the cushion has an inverted trapezoid structure and the cushion is in an interference fit with the accommodating slot.

4. The bearing frame according to claim 1, wherein a dust-proof pad is disposed at a position of the bottom plate adjacent to at least one side thereof for bearing a peripheral area of the display panel.

5. The bearing frame according to claim 4, wherein the dust-proof pad is disposed at all positions of the bottom plate for bearing the peripheral area of the display panel.

6. The bearing frame according to claim 4, wherein a dust-proof slot is disposed in a position of the bottom plate corresponding to the dust-proof pad, and the dust-proof slot is more adjacent to the side plate than the dust-proof pad.

7. The bearing frame according to claim 6, wherein the dust-proof pad extends to a position above an adjacent dust-proof slot and covers a part of an opening of the dust-proof slot.

8. The bearing frame according to claim 4, wherein a surface of the dust-proof pad facing towards a side plate adjacent thereto is an inclined surface which inclines towards the cushion.

9. The bearing frame according to claim 4, wherein a black diffuse layer is disposed on a surface of the dust-proof pad facing away from the bottom plate.

10. The bearing frame according to claim 4, wherein outside surfaces of the dust-proof pad and the cushion are coarse surfaces.

11. The bearing frame according to claim 10, wherein the dust-proof pad and the cushion are formed as an integrated structure.

12. The bearing frame according to claim 11, wherein the dust-proof pad is formed from silicone material and/ or the cushion is formed from silicone material.

13. A display device comprising a display panel and the bearing frame for the display panel according to claim 1.

14. The display device according to claim 13, wherein the display panel is an OLED display panel.

* * * * *